(12) United States Patent
Buer

(10) Patent No.: US 8,976,616 B2
(45) Date of Patent: *Mar. 10, 2015

(54) MULTI-TIME PROGRAMMABLE MEMORY

(71) Applicant: Broadcom Corporation, Irvine, CA (US)

(72) Inventor: Myron Buer, Savage, MN (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/894,047

(22) Filed: May 14, 2013

(65) Prior Publication Data

US 2013/0250647 A1    Sep. 26, 2013

Related U.S. Application Data

(63) Continuation of application No. 13/034,395, filed on Feb. 24, 2011, now Pat. No. 8,462,575.

(60) Provisional application No. 61/364,248, filed on Jul. 14, 2010.

(51) Int. Cl.
*G11C 17/18* (2006.01)

(52) U.S. Cl.
USPC ...... 365/225.7; 365/94; 365/96; 365/189.011

(58) Field of Classification Search
USPC ............................. 365/225.7, 94, 96, 189.011
See application file for complete search history.

(56) References Cited

U.S. PATENT DOCUMENTS

| | | | | |
|---|---|---|---|---|
| 6,525,953 | B1 * | 2/2003 | Johnson | 365/63 |
| 6,704,235 | B2 * | 3/2004 | Knall et al. | 365/225.7 |
| 6,930,920 | B1 | 8/2005 | Look | |
| 6,933,591 | B1 | 8/2005 | Sidhu et al. | |
| 6,979,879 | B1 | 12/2005 | Yindeepol et al. | |
| 7,561,456 | B2 * | 7/2009 | Vasiliu | 365/96 |
| 7,649,798 | B2 | 1/2010 | Schmitt et al. | |
| 7,660,180 | B2 * | 2/2010 | Boeve et al. | 365/225.7 |
| 7,696,017 | B1 | 4/2010 | Tripsas et al. | |
| 8,462,575 | B2 * | 6/2013 | Buer | 365/225.7 |
| 2012/0014200 | A1 | 1/2012 | Buer | |

FOREIGN PATENT DOCUMENTS

| | | |
|---|---|---|
| CN | 1825488 A | 8/2006 |
| CN | 101364588 A | 2/2009 |

OTHER PUBLICATIONS

English-Language Translation for Chinese Patent Publication No. CN 1825488 A, published Aug. 30, 2006; 2 pages.
English-Language Translation for Chinese Patent Publication No. CN 101364588 A, published Feb. 11, 2009; 1 page.
Chinese Office Action directed to related Chinese Patent Application No. 201110196968.2, mailed Aug. 5, 2013; 6 pages.

* cited by examiner

*Primary Examiner* — Pho M. Luu
(74) *Attorney, Agent, or Firm* — Sterne, Kessler, Goldstein & Fox P.L.L.C.

(57) ABSTRACT

Methods and systems that extend the capability of fuse elements, anti-fuse elements, and combinations thereof to enable multi-time programmable memory elements are provided. Accordingly, significantly reduced area requirements and control circuitry complexity of memory elements is enabled. The provided methods and systems can be used in non-volatile memory storage, and are suitable for use in system on chip (SoC) products.

20 Claims, 6 Drawing Sheets

MULTI-TIME PROGRAMMABLE MEMORY

CROSS-REFERENCE TO RELATED APPLICATIONS

The present application is a continuation of U.S. application Ser. No. 13/034,395, filed Feb. 24, 2011, now U.S. Pat. No. 8,462,575, which claims the benefit of U.S. Provisional Patent Application No. 61/364,248, tiled on Jul. 14, 2010, both of which are incorporated herein by reference in their entireties.

BACKGROUND

1. Field of the Invention

The present invention relates generally to memory elements.

2. Background Art

Conventional fuse and anti-fuse elements provide one-time programmable memory elements. In other words, the element starts in a default or initial state and can be programmed only once into a final state. Once programmed into the final state, the element cannot be re-programmed into a further state.

Conventionally, to enable multi-time programmability, the fuse or anti-fuse element is replicated based on the desired programmability. Thus, conventional fuse and anti-fuse elements can be area inefficient solutions when large memory is needed.

Accordingly, there is a need for multi-time programmable memory elements.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
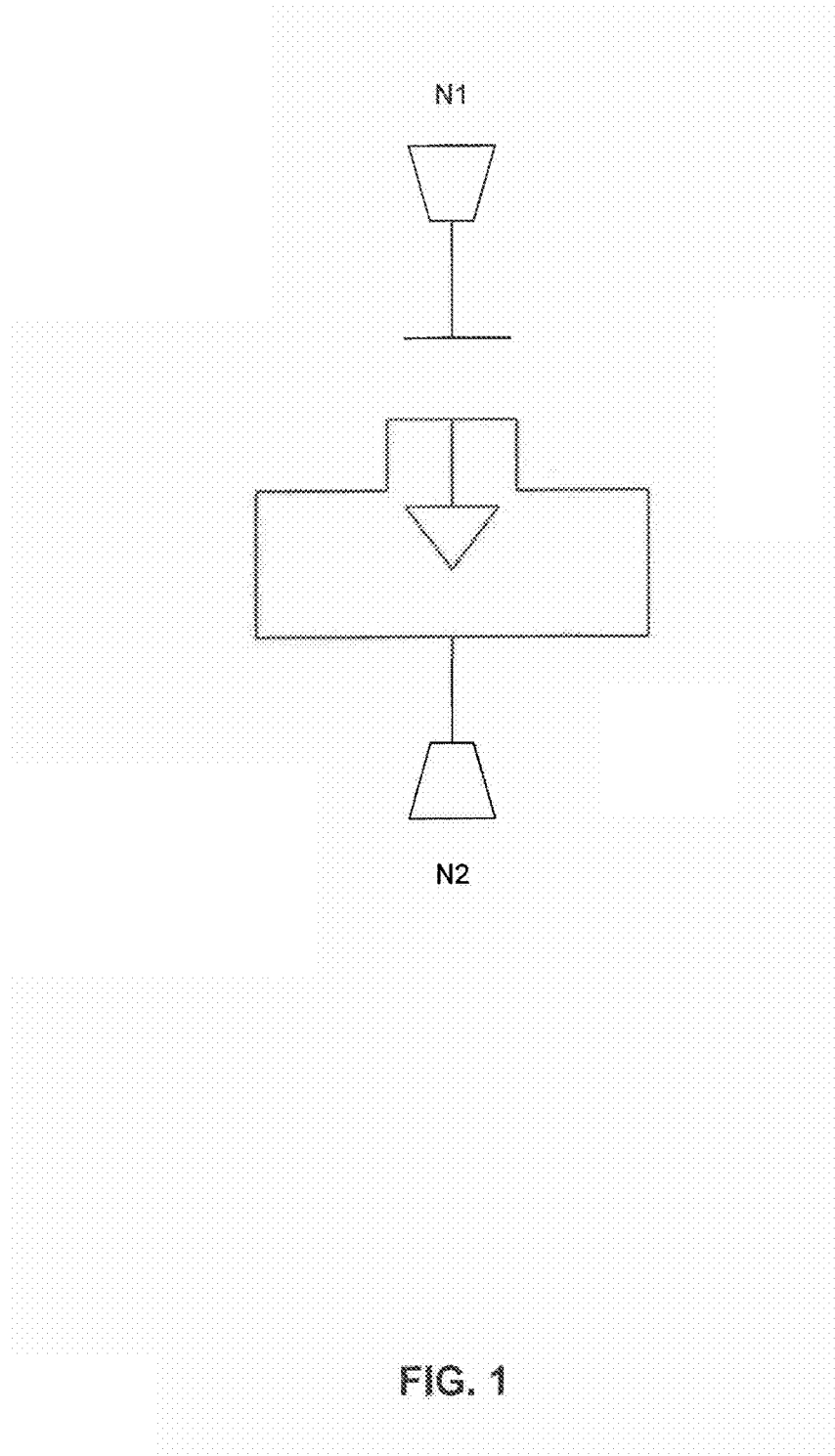
FIGS. 1-4 illustrate various one-time programmable memory elements.

FIGS. 6A-D illustrate example programming states of a memory element according to an embodiment of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Fuse and anti-fuse elements can be used as memory elements. Generally, an anti-fuse element is one that initially is in an open or high impedance state and which can be programmed once into a short or low impedance state. A fuse element is one that initially is in a short or low impedance state and which can be programmed once into an open or high impedance state. Thus, fuse and anti-fuse elements are generally one-time programmable memory elements. The initial or default state may correspond to a logic 0 or to a logic 1, with the subsequent programming state corresponding to a logic 1 or logic 0, respectively.

FIG. 1 illustrates an example NMOS anti-fuse element. The NMOS anti-fuse element is a gate oxide that starts in an open or high impedance state and which can be programmed into a short or low impedance state. Programming of the NMOS anti-fuse element is done by providing a high voltage across its terminals N1 and N2. The high voltage breaks down the oxide, turning it into a resistive short between N1 and N2. Further description of an NMOS anti-fuse element can be found in commonly-owned U.S. Pat. No. 7,649,798, which is incorporated herein by reference in its entirety.

Figure 2:
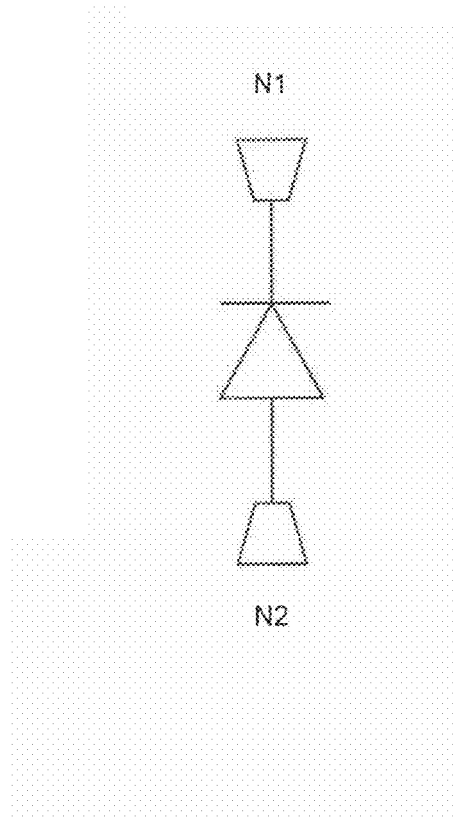

FIG. 2 illustrates an example poly diode anti-fuse element. The poly diode anti-fuse element is a non-salicided poly silicon having a highly N-doped region and a highly P-doped region, which create a reverse biased junction (or effectively a diode). The poly diode anti-fuse starts in an open or high impedance state and can be programmed into a short or low impedance state. Programming of the poly diode anti-fuse is done by providing a high voltage across its terminals N1 and N2 to cause it into a highly reverse biased state, which ultimately shorts the element.

Figure 3:
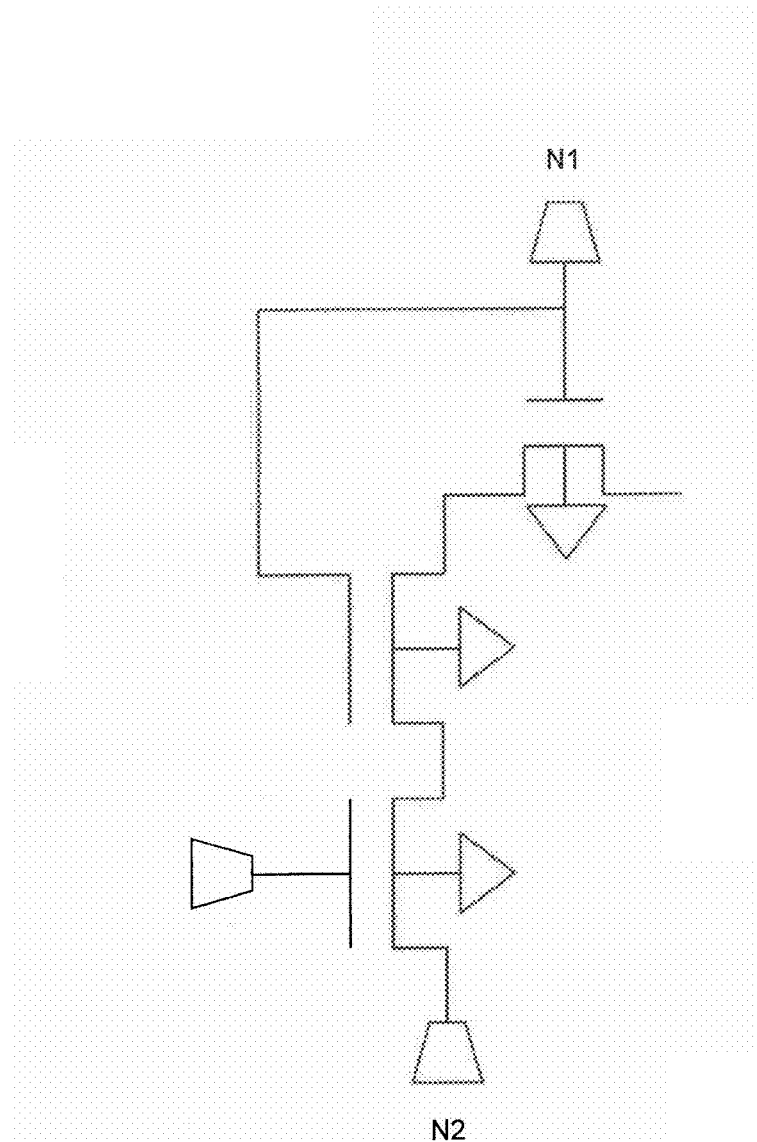

FIG. 3 illustrates an example 3T (three-transistor) anti-fuse. As with the NMOS anti-fuse and the poly diode anti-fuse, the 3T anti-fuse starts in an open state or high impedance state and can be programmed into a short or low impedance state.

Figure 4:
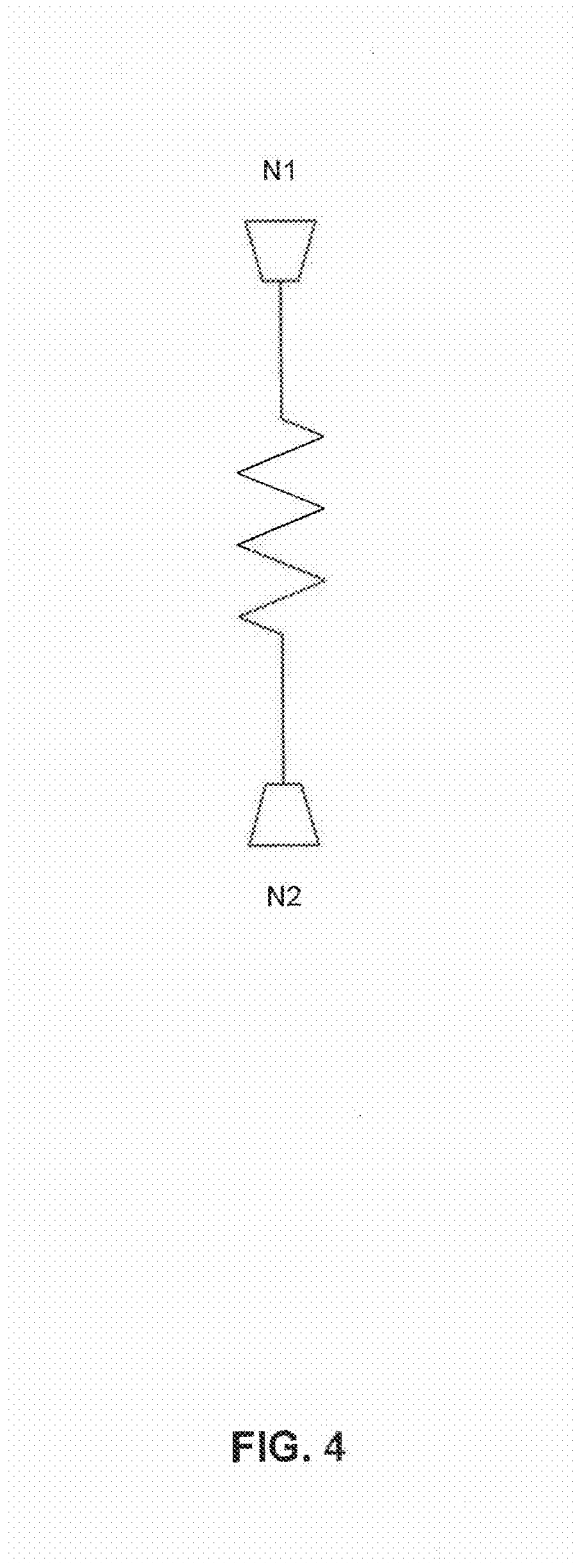

FIG. 4 illustrates an example poly fuse element. The poly fuse element is a poly silicon resistor having a salicide (self-aligned silicide) top layer. The poly fuse element starts in a short or low impedance state and can be programmed into an open or high impedance state. Programming of the poly fuse element is done by applying a high current through it, which causes the melting of the salicide top layer, thereby creating a change in the impedance of the poly fuse element (from low impedance to a higher impedance). Further description of a programmable poly fuse element can be found in commonly-owned U.S. Pat. No. 7,561,456, which is incorporated herein by reference in its entirety.

Conventional fuse and anti-fuse elements, such as the ones illustrated in FIGS. 1-4, provide one-time programmable memory elements. In other words, the element starts in a default or initial state and can be programmed only once into a final state. Once programmed into the final state, the element cannot be re-programmed into a further state.

Conventionally, to enable multi-time programmability, the fuse or anti-fuse element is replicated based on the desired programmability. For example, to enable a two-time programmable k-bit anti-fuse memory structure, two k-bit banks of anti-fuse elements are needed, with the first bank corresponding to the initial state of the memory structure and the second bank corresponding to the final state. Thus, conventional fuse and anti-fuse elements can be area inefficient solutions when large memory is needed. Additionally, to enable multi-time programmability, control circuitry, including multiplexing and/or logic circuitry, for example, is needed to determine which bank of elements should be read at any given time and to enable the reading of the currently programmed bank. Further, because each additional programming state (after the first programming) of the memory structure corresponds to a separate bank of elements, even when a single bit of data of the k-bit memory structure is being modified (i.e., a single fuse or anti-fuse element is being programmed) the entire k-bit memory structure must be re-written into the bank corresponding to the additional programming state.

Embodiments extend the capability of fuse elements, anti-fuse elements, and combinations thereof to enable multi-time programmable memory elements. At the same time, embodiments significantly reduce area requirements and control circuitry complexity. Embodiments can be used in non-volatile memory storage, for example, and are suitable for use in system on chip (SoC) products. In the following, exemplary embodiments will be provided. As would be understood by a person skilled in the art based on the teachings herein, embodiments are not limited to the exemplary embodiments provided herein, but extend to any variations and/or improvements that would be apparent to a person skilled in the art.

Figure 5:
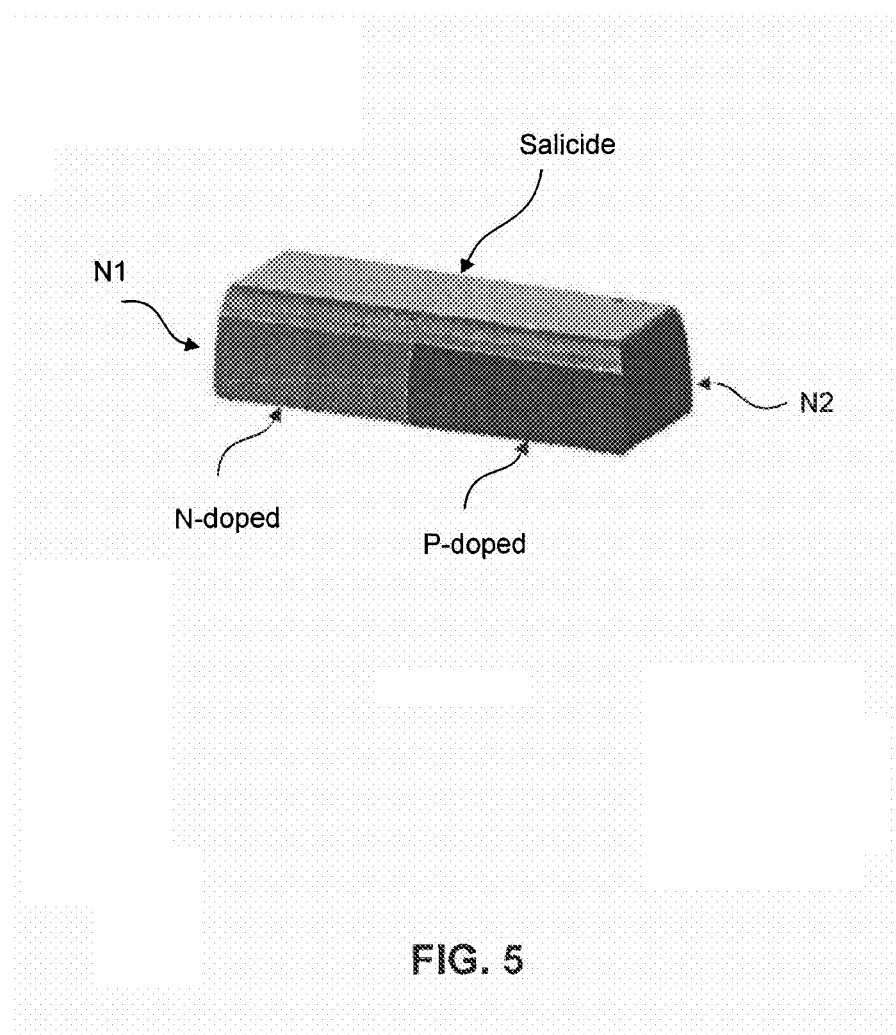
FIG. 5 illustrates an example memory element according to an embodiment of the present invention.

FIG. 5 illustrates an example memory element according to an embodiment of the present invention. In particular, FIG. 5 shows an example poly silicon element. The poly silicon element includes an N-doped and a P-doped region, which create a poly silicon diode, underlying a salicide top layer.

The poly silicon element, as further described below, is a multi-time programmable element. In an embodiment, the poly silicon element can be designed as a three-time programmable element. While the poly silicon element may be slightly larger than a conventional poly fuse or a conventional poly diode anti-fuse, by providing multi-time programmability (e.g., up to three times) significant area savings can still be achieved. Furthermore, when used in a memory structure (e.g., k-bit memory), the memory element can be re-programmed independently of other memory elements, thereby eliminating the need to re-write the entire k-bit memory structure each time that a memory element is re-programmed. Accordingly, re-writing of the k-bit memory structure is only needed when a given memory element has exhausted its re-programmability ability.

In an embodiment, the poly silicon element shown in FIG. 5 provides a three-time programmable memory element, as further described with reference to FIGS. 6A-D. As would be understood by a person of skill in the art based on the teachings herein, embodiments may be designed to have more than three programming states.

Figures 6A, 6B, 6C, 6D:
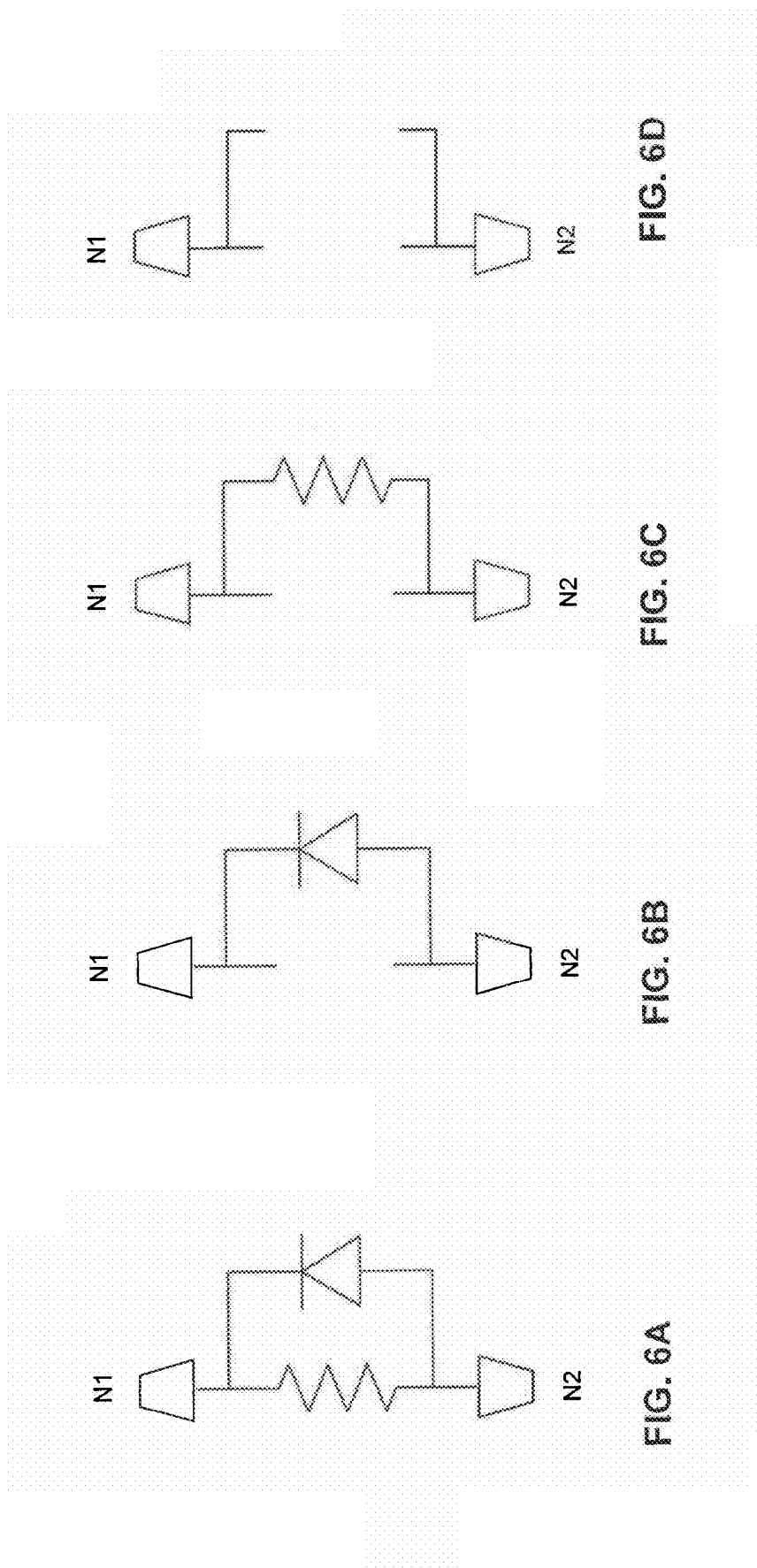

In its initial or default state (e.g., corresponds to logic 0), the poly silicon element can be schematically represented, as shown in FIG. 6A, as a poly fuse element (the salicide layer) in parallel with a poly diode anti-fuse element (the N-doped and P-doped region). Because the poly fuse provides a very low impedance in parallel with the poly diode anti-fuse, the poly silicon element is effectively a short circuit.

The poly silicon element provides a first programming state (e.g., to re-program the element from a logic 0 to a logic 1) as shown in FIG. 6B. To arrive at the first programming state, a high current is applied to the poly silicon element between its terminals N1 and N2 to open the salicide layer. With the salicide layer eliminated as a conduction path between N1 and N2, a high impedance is created by the underlying poly diode anti-fuse. The low to high impedance change corresponds to a logic 0 to a logic 1 re-programming of the element, for example.

When further re-programming is needed, the poly silicon element provides a second programming state (e.g., to re-program the element from a logic 1 to a logic 0) as shown in FIG. 6C. The second programming state is reached by providing a high voltage across the terminals N1 and N2 to cause the poly diode anti-fuse into a highly reversed biased state, effectively causing it to act as a resistive element with low impedance.

When further re-programming is needed, the poly silicon element provides a third and final programming state (e.g., to re-program the element from a logic 0 to a logic 1) as shown in FIG. 6D. The third programming state is reached by providing a very high current through the n-p junction, effectively opening the junction to act as an open circuit or a high impedance between N1 and N2.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. it is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for programming a memory element comprised of a poly diode anti-fuse coupled in parallel with a poly fuse, comprising:
applying a first current between a first terminal and a second terminal of the memory element, wherein the first current is configured to open the poly fuse to transition the memory element from an initial programming state to a first programming state, and wherein a first impedance of the memory element in the first programming state is higher than an initial impedance of the memory element in the initial programming state.

2. The method of claim 1, wherein the memory element is equivalent to a short circuit between the first terminal and the second terminal in the initial programming state.

3. The method of claim 1, wherein the first impedance of the memory element is provided by the poly diode anti-fuse in the first programming state.

4. The method of claim 1, further comprising:
applying a voltage across the first terminal and the second terminal, wherein the voltage is configured to highly reverse bias the poly diode anti-fuse to transition the memory element from the first programming state to a second programming state.

5. The method of claim 4, wherein a second impedance of the memory element in the second programming state is lower than the first impedance of the memory element in the first programming state.

6. The method of claim 5, wherein the second impedance of the memory element is provided by the poly diode anti-fuse in the second programming state.

7. The method of claim 4, further comprising:
applying a second current between the first terminal and the second terminal, wherein the second current is configured to open an n-p junction of the poly diode anti-fuse to transition the memory element from the second programming state to a third programming state.

8. The method of claim 7, wherein a third impedance of the memory element in the third programming state is higher than the second impedance of the memory element in the second programming state.

9. The method of claim 7, wherein the memory element is equivalent to an open circuit between the first terminal and the second terminal in the third programming state.

10. A memory element having an initial programming state and a first programming state, comprising:
- a first terminal and a second terminal;
- a poly diode anti-fuse coupled to the first terminal and the second terminal; and
- a poly fuse,
- wherein, in the initial programming state, the poly diode anti-fuse is coupled in parallel with the poly fuse to provide an initial impedance of the memory element, and
- wherein, in the first programming state, the poly fuse is open to provide a first impedance of the memory element, different than the initial impedance of the memory element.

11. The memory element of claim 10, wherein the first impedance of the memory element is higher than the initial impedance of the memory element.

12. The memory element of claim 10, wherein the poly diode anti-fuse includes an N-doped region, coupled to the first terminal, and a P-doped region, coupled to the second terminal.

13. The memory element of claim 10, wherein the poly fuse includes a silicide layer.

14. The memory element of claim 10, wherein the memory element further has a second programming state, and wherein, in the second programming state, the poly diode anti-fuse is in a highly reverse biased state.

15. The memory element of claim 14, wherein a second impedance of the memory element in the second programming state is lower than the first impedance of the memory element in the first programming state.

16. The memory element of claim 14, wherein the memory element further has a third programming state, and wherein, in the third programming state, an n-p junction of the poly diode anti-fuse is open.

17. The memory element of claim 16, wherein a third impedance of the memory element in the third programming state is higher than the second impedance of the memory element in the second programming state.

18. A method for programming a memory element comprised of a poly diode anti-fuse coupled in parallel with a poly fuse, comprising:
- applying a first current between a first terminal and a second terminal of the memory element, wherein the first current is configured to open the poly fuse to transition the memory element from an initial programming state to a first programming state; and
- applying a voltage across the first terminal and the second terminal, wherein the voltage is configured to highly reverse bias the poly diode anti-fuse to transition the memory element from the first programming state to a second programming state.

19. The method of claim 18, further comprising:
- applying a second current between the first terminal and the second terminal, wherein the second current is configured to open an n-p junction of the poly diode anti-fuse to transition the memory element from the second programming state to a third programming state.

20. The method of claim 18, wherein the poly diode anti-fuse includes an N-doped region, coupled to the first terminal, and a P-doped region, coupled to the second terminal, and wherein the poly fuse includes a silicide layer.

* * * * *